United States Patent
Voss et al.

(10) Patent No.: US 9,224,806 B2
(45) Date of Patent: Dec. 29, 2015

(54) EDGE TERMINATION STRUCTURE WITH TRENCH ISOLATION REGIONS

(71) Applicant: Infineon Technologies AG, Neubiberg (DE)

(72) Inventors: Stephan Voss, Munich (DE); Alexander Breymesser, Villach (AT); Hans-Joachim Schulze, Taufkirchen (DE); Erich Griebl, Dorfen (DE); Oliver Haeberlen, Villach (AT); Andreas Moser, Maria Rain (AT)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 13/961,155

(22) Filed: Aug. 7, 2013

(65) Prior Publication Data
US 2015/0041946 A1   Feb. 12, 2015

(51) Int. Cl.
*H01L 29/06* (2006.01)
*H01L 21/761* (2006.01)

(52) U.S. Cl.
CPC ............ *H01L 29/063* (2013.01); *H01L 21/761* (2013.01); *H01L 29/0619* (2013.01)

(58) Field of Classification Search
CPC ............ H01L 29/7811; H01L 29/0692; H01L 29/4238; H01L 29/063; H01L 29/0619; H01L 21/761
See application file for complete search history.

(56) References Cited

U.S. PATENT DOCUMENTS

2013/0336033 A1*  12/2013  Hirler et al. .................. 363/124

* cited by examiner

*Primary Examiner* — Whitney T Moore
(74) *Attorney, Agent, or Firm* — Murphy, Bilak & Homiller, PLLC (57) ABSTRACT

A semiconductor device includes a semiconductor body and an edge termination structure. The edge termination structure comprises a first oxide layer, a second oxide layer, a semiconductor mesa region between the first oxide layer and the second oxide layer, and a doped field region comprising a first section in the semiconductor mesa region, and a second section in a region below the semiconductor mesa region. The second section overlaps the first and the second oxide layers in the region below the semiconductor mesa region.

19 Claims, 5 Drawing Sheets

EDGE TERMINATION STRUCTURE WITH TRENCH ISOLATION REGIONS

TECHNICAL FIELD

Embodiments of the present invention relate to a method for producing an edge termination structure in a semiconductor device, and to a semiconductor device with an edge termination structure.

BACKGROUND

Power semiconductor devices, such as power diodes, power MOSFETs, or power IGBTs, are designed to withstand high blocking voltages. Those power devices include a pn-junction that is formed between a p-doped semiconductor region and an n-doped semiconductor region. The device blocks (is switched off) when the pn-junction is reverse biased. In this case a depletion region (space charge region) propagates in the p-doped and n-doped regions. Usually one of these n-doped and p-doped semiconductor regions is more lightly doped than the other one of these semiconductor regions, so that the depletion region mainly extends in the more lightly doped region, which mainly supports the voltage applied across the pn-junction.

The ability of a pn-junction to support high voltages is limited by the avalanche breakdown phenomenon. As a voltage applied to a pn-junction increases, an electric field in the semiconductor regions forming the pn-junction increases. The electric field results in an acceleration of mobile charge carriers present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of an avalanche breakdown a significant current flows across the pn-junction in the reverse direction. The voltage at which the avalanche breakdown sets in is referred to as breakdown voltage.

The electric field at which the avalanche breakdown sets in is referred to as critical electric field ($E_{crit}$). The absolute value of the critical electric field is mainly dependent on the type of semiconductor material used for forming the pn-junction, and is weakly dependent on the doping concentration of the more lightly doped semiconductor region.

The critical electric field is a theoretical value that is defined for a semiconductor region that has an infinite size in directions perpendicular to field strength vectors of the electric field. Power semiconductor devices, however, have a semiconductor body of finite size that is terminated by edge surfaces in lateral directions. In vertical power semiconductor devices, which are semiconductor devices in which the pn-junction mainly extends in a horizontal plane of the semiconductor body, the pn-junction usually does not extend to the edge surface of the semiconductor body but is distant to the edge surface of the semiconductor body in a lateral direction. In this case, a semiconductor region (edge region) of the semiconductor body adjoining the pn junction in the lateral direction also has to withstand the blocking voltage.

In the edge region, an edge termination structure can be implemented that helps to improve the voltage blocking capability in the edge region. Different types of edge termination structures are known. One of those edge termination structures includes a doped field ring that surrounds the semiconductor region with the pn junction and that is connected to a field plate.

SUMMARY

A first embodiment relates to a semiconductor device including a semiconductor body, and an edge termination structure. The edge termination structure includes a first oxide layer in a first trench of the semiconductor body, a second oxide layer in a second trench of the semiconductor body, a semiconductor mesa region between the first oxide layer and the second oxide layer, and a doped semiconductor region of one doping type in the semiconductor mesa region and in a region below the semiconductor mesa region.

A second embodiment relates to a method for producing an edge termination structure. The method includes forming a first trench in a first surface of a semiconductor body, and forming a second trench in the first surface of the semiconductor body, wherein the second trench is formed spaced apart from the first trench such that there is a semiconductor mesa region between the first trench and the second trench. The method further includes forming a first oxide layer in the first trench by oxidizing the semiconductor body in regions adjacent the first trench, forming a second oxide layer in the second trench by oxidizing the semiconductor body in regions adjacent the second trench. The first oxide layer and the second oxide layer are formed such that at least a section of the semiconductor mesa region remains between the first oxide layer and the second oxide layer. Further, dopant atoms are introduced into the semiconductor mesa region and a region below the semiconductor mesa region.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

One embodiment of a method for producing an edge termination structure in a semiconductor body is explained with reference to FIGS. 1A to 1D. FIGS. 1A to 1D each illustrate a vertical cross sectional view of one section of the semiconductor body 100. Referring to FIGS. 1A to 1D, the semiconductor body 100 includes a first surface 101. The vertical cross sectional views shown in FIGS. 1A to 1D show the semiconductor body 100 in a section plane that is substantially perpendicular to the first surface 101.

The semiconductor body 100 (that can also be referred to as semiconductor chip or semiconductor die) may include a conventional semiconductor material, such as silicon (Si), silicon carbide (SiC), silicon germanium (SiGe), gallium nitride (GaN), or combinations thereof. The process sequences explained in the following can be applied simultaneously to a plurality of semiconductor bodies that are part of a semiconductor wafer before the semiconductor wafer is subdivided into the individual semiconductor bodies.

Figure 1A:
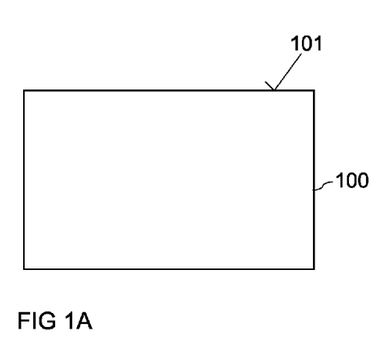
FIGS. 1A to 1D illustrate one embodiment of a method for producing an edge termination structure that includes a field region.

FIG. 1A shows a vertical cross sectional view of the semiconductor body 100. FIG. 1A only shows a section of the semiconductor body 100, namely the section in which features of the edge termination structure are produced. In this section, the semiconductor body 100 may include a basic doping of a first doping type. According to one embodiment, the first doping type is an n-type doping. The doping concentration of the basic doping is, for example, between 1E12 $cm^{-3}$ and 1E15 $cm^{-3}$.

Figure 1B:
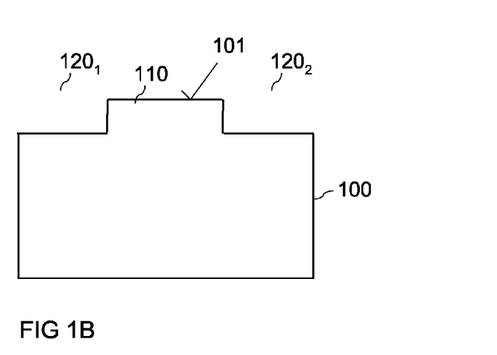

Referring to FIG. 1B, a first trench $120_1$ and a second trench $120_2$ are formed in the first surface 101 and spaced apart from each other such that a semiconductor mesa region 110 remains between the first trench $120_1$ and the second trench $120_2$. Forming the first trench $120_1$ and the second trench $120_2$ may include conventional process sequences for forming trenches in a surface of a semiconductor body, such as etching processes using an etch mask.

Figure 1C:
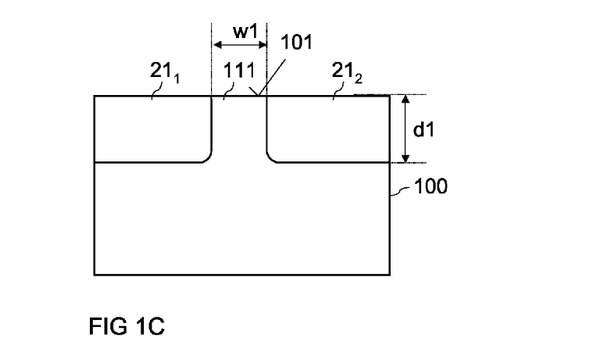

Referring to FIG. 1C, a first oxide layer, first oxide region $21_1$, is formed in the first trench $120_1$, and a second oxide layer, second oxide region $21_2$, is formed in the second trench $120_2$. Forming each of the first and second oxide layers $21_1$, $21_2$ includes oxidizing the semiconductor body 100 at a bottom and at sidewalls and the first trench $120_1$ and the second trench $120_2$, respectively. This oxidation process consumes semiconductor material along the bottoms and the sidewalls of the first and second trenches $120_1$, $120_2$ so that the first and second oxide layers $21_1$, $21_2$ finally extend deeper into the semiconductor body 100 from the first surface 101 than the first and second trenches $120_1$, $120_2$. Further, a semiconductor mesa region 111 remaining between the first and second oxide layers $21_1$, $21_2$ is narrower than the mesa region 110 between the first and second trenches $120_1$, $120_2$ shown in FIG. 1B. The semiconductor mesa region 111 is a section of the semiconductor body 100 that is terminated by the first and second oxide layers $21_1$, $21_2$.

According to one embodiment, a width w1 of the mesa region 111 between the first and second oxide layers $21_1$, $21_2$ is larger 3 micrometers (μm), such as between 5 micrometers and 10 micrometers. According to one embodiment, the first and second oxide layers $21_1$, $21_2$ are produced such that upper surfaces of the first and second oxide layers $21_1$, $21_2$ are substantially coplanar with the first surface 101 of the semiconductor body 100 on top of the mesa region 111. For example, the first and second oxide layers $21_1$, $21_2$ do not extend beyond the first surface 101 of the semiconductor body 100 more than 150 nm. A depth d1 of the first and second oxide layers $21_1$, $21_2$ can be adjusted by adjusting a duration of the oxidation process, wherein the depth d1 increases as the duration of the oxidation process increases. The depth of the first and second oxide layers $21_1$, $21_2$ is the dimension of the oxide layers $21_1$, $21_2$ in the vertical direction of the semiconductor body 100, which is a direction perpendicular to the first surface 101.

According to one embodiment, the oxidation process is controlled such that the oxidation process stops when the first and second oxide layers $21_1$, $21_2$ completely fill the first trench $120_1$ and the second trench $120_2$, respectively. If the oxidation process is stopped when the first and second oxide layers $21_1$, $21_2$ have upper surfaces that are substantially coplanar with the first surface 101, then, in a semiconductor body 100 that includes silicon, a depth (thickness) d1 of the first and second oxide layers $21_1$, $21_2$ is substantially twice a depth of the first and second trenches $120_1$, $120_2$. Thus, the depth d1 of the first and second oxide layers $21_1$, $21_2$ can further be adjusted by adjusting the depth of the first and second trenches $120_1$, $120_2$. A depth d1 of the first and second oxide layers $21_1$, $21_2$ is, for example, larger than 300 nanometers (nm), larger than 500 nanometers, larger than 1 micrometer, larger than 1.5 micrometers, larger than 3 micrometers, or even larger than 3 micrometers.

Figure 1D:
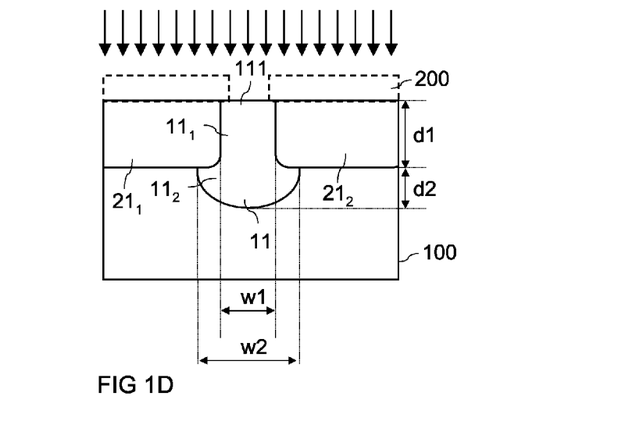

Referring to FIG. 1D, the method further includes introducing dopant atoms into the semiconductor mesa region 111 between the first and second oxide layers $21_1$, $21_2$ and into a region below the semiconductor mesa region 111, so as to form a doped field region 11 in and below the semiconductor mesa region 111. The doping type of the field region 11 is, for example, complementary to the doping type of a basic doping of the semiconductor body 100 in a region surrounding the field region 11. According to one embodiment, the field region 11 is a p-type region.

According to one embodiment, introducing the dopant atoms for forming the field region 11 includes an implantation process in which dopant atoms are implanted into the mesa region 111, and a subsequent diffusion process in which the implanted dopant atoms diffuse deeper into the semiconductor body 100 and, in particular, into a region below the mesa region 111. The implantation of the dopant atoms into the mesa region 111 may include the use of an implantation mask 200 (illustrated in dashed lines in FIG. 1D) that has an opening above the mesa region 111. This implantation mask 200 prevents the implantation of dopant atoms into the oxide layers $21_1$, $21_2$ and into sections of the mesa region 111. However, the use of the implantation mask 200 is optional and may be omitted. Alternatively, the first and second oxide layers $21_1$, $21_2$ may act as an implantation mask that prevents dopant atoms from being implanted into other regions of the semiconductor body 100 than the mesa region 111. The dopant atoms are, for example, implanted with a dopant dose between 1E13 and 1E15 $cm^{-3}$.

Referring to FIG. 1D, the field region 11 includes a first section $11_1$ in the mesa region 111, and a second section $11_2$ below the mesa region 111. The second section $11_2$ overlaps both the first and second oxide layers $21_1$, $21_2$ in a region below the mesa region 111, so that the second section $11_2$ is wider in a first lateral direction than the first section $11_1$. That is, w2>w1, where w2 is a maximum width of the second section in the lateral direction, and w1 is the width of the first section $11_1$ (which corresponds to a width of the mesa region 111, and a distance between the first and second oxide layers $21_1$, $21_2$ in the first lateral direction. The vertical cross sectional view of the field region resembles a mushroom, with the first section $11_1$ resembling the stipe, and the second section resembling the cap.

In FIG. 1D, d2 denotes a depth of the second section $11_2$. The depth d2 is a maximum dimension of the second section $11_2$ in the vertical direction and defines how deep the second section $11_2$ extends into the semiconductor body 100 in the vertical direction from the first and second oxide layers $21_1$, $21_2$. The depth d2 and the width w2 of the second section can be adjusted through the duration and/or the temperature of the diffusion process explained above. The width w2 and the depth d2 increase as the duration and/or the temperature of the diffusion process increases. There is a correlation between the width w2 and the depth d2 such that an increase of the depth d2 is associated with an increase of the width. However, the depth d2 and the width w2 can be adjusted independently across wide ranges. The width w2 of the second section is defined by the width w1 of the mesa region 111 and a lateral diffusion of the introduced doping atoms during the diffusion process, where this lateral diffusion increases as the duration and/or the temperature of the diffusion process increases. The depth d2 is defined by how deep dopant atoms are introduced during the implantation process and a vertical diffusion of the introduced dopant atoms. According to one embodiment, dopant atoms are only introduced into the mesa region 111 from where they diffuse into the region below the mesa region. According to another embodiment, dopant atoms are introduced into the mesa region 111, and the region below the mesa region 111 from where they diffuse deeper into the semiconductor body.

Thus, the geometry of the field ring 11 shown in FIG. 1D can be well defined by the depth d1 of the first and second oxide layers $21_1$, $21_2$, and the distance w1 between these first and second oxide layers $21_1$, $21_2$ in the lateral direction, by the implantation depth, and by the duration and/or the temperature of the diffusion process. A pn junction between the field ring 11 and the surrounding semiconductor region is distant to the first surface 101 in a region below the first and second oxide layers $21_1$, $21_2$. Thus, a voltage breakdown that may occur when the pn-junction is reverse biased occurs distant to the first surface 101 in a region below the relatively thick oxide layers $21_1$, $21_2$. Thus, the highest electric field occurs distant to the first surface 101, below the oxide layers $21_1$, $21_2$, so that parasitic charges that may occur along the first surface 101 are not subject to the highest electric field and, therefore, are less likely to decrease the voltage blocking capability of the device.

According to one embodiment, the depth of the second section d2 is between 5 micrometers and 10 micrometers. A difference (w2−w1)/2 between the second width w2 and the first width w1 is, for example, between 0.2 µm and 10 µm, in particular between 0.5 µm and 5 µm or between 1 µm and 4 µm.

Figure 2:
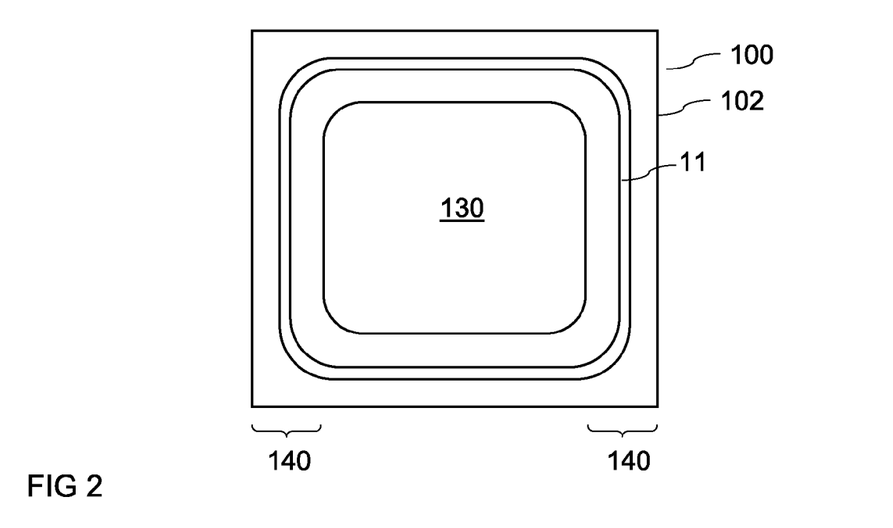
FIG. 2 illustrates a top view of a semiconductor body including an edge termination structure with a ring-shaped field region.

FIG. 2 shows a top view of the first surface 101 of the semiconductor body 100 after the process sequence explained with reference to FIGS. 1A to 1D has been performed. Other than FIGS. 1A to 1D, FIG. 2 schematically illustrates the complete semiconductor body 100.

Referring to FIG. 2, the semiconductor body 100 may include an inner region 130 and an edge region 140 surrounding the inner region 130. The inner region 130 may include active device regions of a semiconductor device integrated in the semiconductor body 100. These active device regions are, for example, source, body and drain regions of a transistor device, such as MOS-gated devices, like IGBT or MOSFET devices. Embodiments of a transistor device integrated in the inner region 130 of the semiconductor body 100 are explained with reference to FIGS. 5 and 6 herein below.

The edge region 140 can be a region of the semiconductor body 100 between the inner region 130 and an edge surface 102 of the semiconductor body 100 (as illustrated in FIG. 2). However, it is also possible to integrate active device regions of several semiconductor devices in one semiconductor body 100. In this case, the edge region surrounding one inner region may separate this inner region from the edge surface and/or other inner regions. Referring to FIG. 2, the field region 11 is ring-shaped, is located in the edge region 140, and surrounds the inner region 130 of the semiconductor body 100. In the following, the ring-shaped field region will be referred to as field ring 11. This field ring 11 can be produced using the method explained with reference to FIGS. 1A to 1D when the first and second trenches $120_1$, $120_2$ are formed such that a ring-shaped mesa region 110 remains between the first and second trenches. When the edge region 140 is a region between the inner region 130 and the edge surface 102, then one of the first and second trenches may extend to the edge surface 102, wherein the other trench may extend to the inner region 130.

FIG. 2 illustrates only one field-ring 11. However, it is also possible to implement several (basically concentric) distantly arranged field rings one semiconductor body 110.

FIGS. 3A to 3D illustrate one embodiment for producing the first and second trenches $120_1$, $120_2$ and the first and second oxide layers $21_1$, $21_2$ in greater detail. FIGS. 3A to 3D each show a vertical cross sectional view of the semiconductor body 100 during (after) different process steps.

Figure 3A:
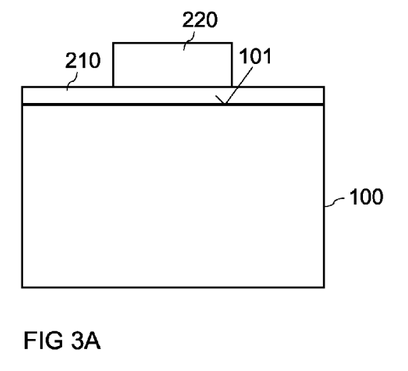
FIGS. 3A to 3E illustrate steps of one embodiment of the method shown in FIGS. 1A to 1D in greater detail.

Referring to FIG. 3A, the method includes forming a first mask layer 210 on the first surface 101 of the semiconductor body 100, and forming a second structured mask layer 220 on the first mask layer 210. The first mask layer 210 is, for example, a hard mask layer, such as a nitride layer. The second mask layer 220 is, for example, a photo resist. The second mask layer 220 is used as an etch mask for etching the hardmask layer and the semiconductor body 100 when producing the first and second trenches $120_1$, $120_2$. This mask layer can be structured a conventional way using a photo technique.

Figure 3B:
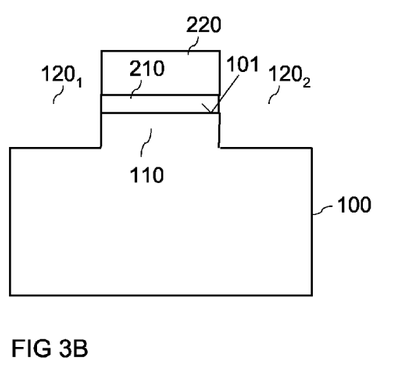

FIG. 3B shows the semiconductor body 100 after an etching process. In this etching process, the second mask 220 (the etch mask) is used as a mask for etching the first mask layer 210 and for etching the semiconductor body 100, so as to form the first trench $120_1$ and the second trench $120_1$, $120_2$ in the semiconductor body 100. During the etching process, the etch mask 220 covers the semiconductor mesa region 110 and prevents the semiconductor mesa region 110 from being etched. The etching process is, for example, an anisotropic etching process. After etching the first and second trenches $120_1$, $120_2$, the etch mask 220 is removed, while the first mask 210 remains on the semiconductor mesa region 110.

Figure 3C:
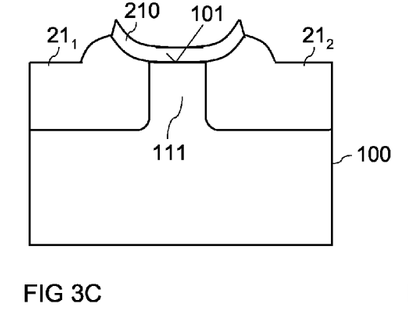

FIG. 3C shows the semiconductor body 100 after the oxidation process in which the first and second oxide layers $21_1$, $21_2$ are formed in the first and second trenches $120_1$, $120_2$. The bottom and the sidewalls of the first and second trenches $120_1$, $120_2$ are oxidized during the oxidation process in a similar manner previously discussed. In a conventional manner, the oxidation process may include heating the semiconductor body 100 to an oxidation temperature in an oxidizing ambient, that is in an oxygen containing ambient.

Referring to FIG. 3C, the first mask 210 prevents the first surface 101 from being exposed to the oxidizing atmosphere so as to prevent the first surface 101 of the mesa region 110 from being oxidized. However, first and second oxide layers $21_1$, $21_2$ are grown on the sidewalls of the first and second trenches $120_1$, $120_2$, so that those parts of the semiconductor mesa region 110 below the first mask 210 and along the sidewalls of the first and second trenches $120_1$, $120_2$ are oxidized. In particular, those sections of the first and second oxide layers $21_1$, $21_2$ that grow along the sidewalls may extend beyond the first surface 101 and may cause edges of the first mask 210 to be bent upwards, as schematically illustrated in FIG. 3C.

Figure 3D:
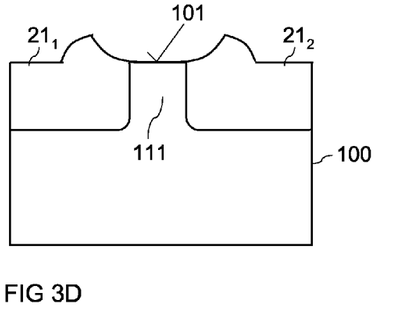

Referring to FIG. 3D, the first mask 210 is removed. Removing the first mask 210 may include a conventional etching process.

Figure 3E:
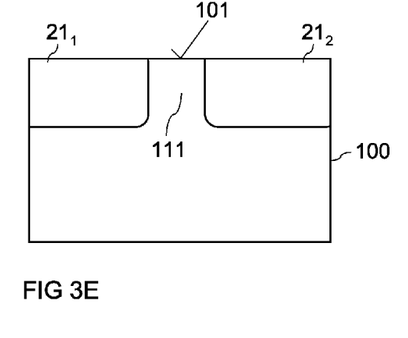

Referring to FIG. 3E, the structure with the first and second oxide layers $21_1$, $21_2$ and the semiconductor mesa region 111 can be planarized in order to make the first and second oxide layers $21_1$, $21_2$ coplanar with the first surface 101. In the planarization process those sections of the first and second oxide layers $21_1$, $21_2$ that extend beyond the first surface 101 of the semiconductor body 100 are removed. The planarization process can be a conventional planarization process, such as a chemical polishing process, a mechanical polishing process, or a chemical-mechanical polishing (CMP) process.

Alternatively to removing the mask layer 210 (see FIG. 3D) and then planarizing the resulting structure (see FIG. 3E), a planarizing process may be applied to structure with the mask layer 210 shown in FIG. 3C. This planarizing process planarizes the oxide layers $21_1$, $21_2$ and, at least partially, removes the mask layer. Sections of the mask layer 210 remaining after the planarizing process may be removed using an etching process.

Figure 4A:
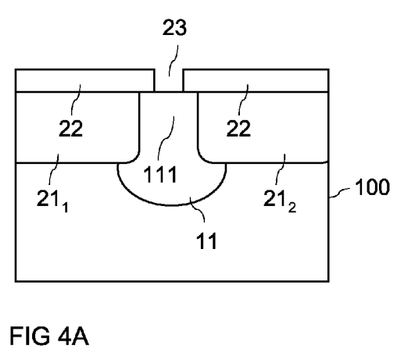
FIGS. 4A and 4B illustrate steps for producing a field electrode that electrically contacts a field ring.
Figure 4B:
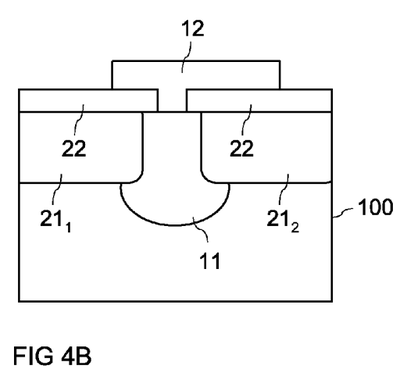

FIGS. 4A and 4B illustrate method steps for producing an optional field electrode 12 of the edge termination structure. Referring to FIG. 4A, an insulation layer 22 that includes an opening 23 above the field region 11 is produced on the first and second oxide layers $21_1$, $21_2$. Referring to FIG. 4A, the insulation layer 22 may cover sections of the mesa region 111. The insulation layer 22 is, for example, a glass layer, such as a BPSG (Boron-Phosphor-Silicate Glass) layer or a PSG (Phosphor-Silicate Glass) layer. The insulation layer 22 can be produced using a deposition process. The opening 23 can be produced by an etching process using an etch mask.

Referring to FIG. 4B, an electrode layer 12 is formed in the opening 23 of the insulation layer 22 and is electrically connected to the field region 11 in the opening 23. Further, the electrode layer 12 covers sections of the insulation layer 22 adjacent the opening 23, so as to form a field electrode (field plate) 12 that is electrically connected to the field region 11 above the insulation layer 22. The field electrode 12 includes, for example, a metal or a highly doped polycrystalline semiconductor material, such as polysilicon. Forming the field electrode may include a deposition process in which an electrode material is deposited in the opening of the insulation layer and on top of the insulation layer, and a structuring process that structures the electrode layer in order to form the field electrode. The structuring process may include an etching process.

Figure 5:
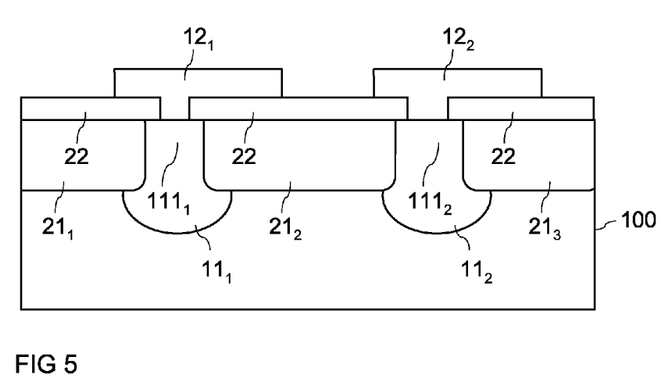
FIG. 5 illustrates a vertical cross sectional view of the semiconductor body including an edge termination structure with two field rings.

FIG. 5 illustrates a vertical cross sectional view of an edge termination structure according to a further embodiment. In this embodiment, the edge termination structure includes two field regions $11_1$, $11_2$ that are spaced apart and each respectively have a field electrode $12_1$, $12_2$ connected thereto. Each of these field regions $11_1$, $11_2$ can be ring shaped as explained with reference to FIG. 2. In this case, the first and second field regions $11_1$, $11_2$ can have the form of concentric rings each surrounding an inner region of the semiconductor body 100. The edge termination structure of FIG. 5 can be produced using the process sequences explained with reference to FIGS. 1, 3 and 4, with the difference that three oxide layers $21_1$, $21_2$, $21_3$ are formed in three trenches, wherein these three trenches define two semiconductor mesa regions resulting in two mesa regions $111_1$, $111_2$ between the oxide layers $21_1$, $21_2$, $21_3$.

The edge termination structure is not restricted to include one or two field rings, but could be implemented with more than two spaced apart field rings as well.

Figure 6:
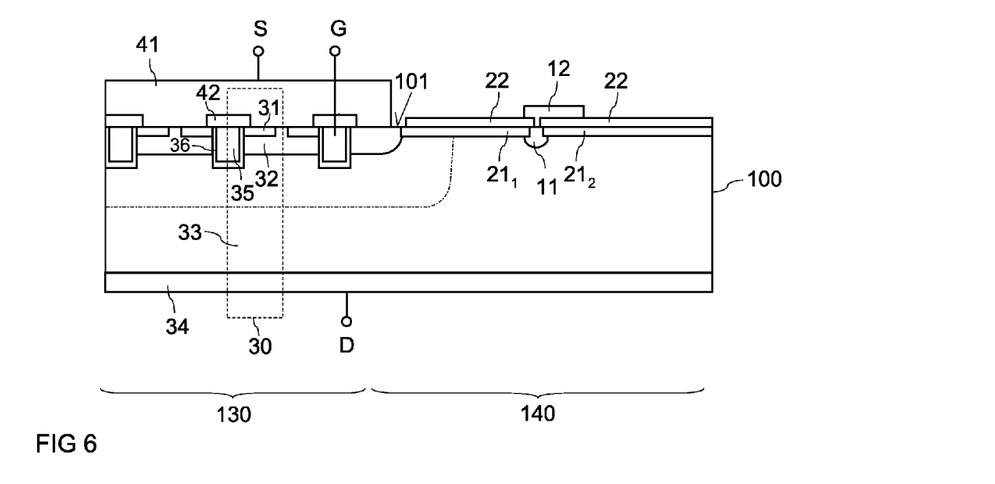
FIG. 6 illustrates one embodiment of a transistor device including an edge termination structure with a field ring.
Figure 7:
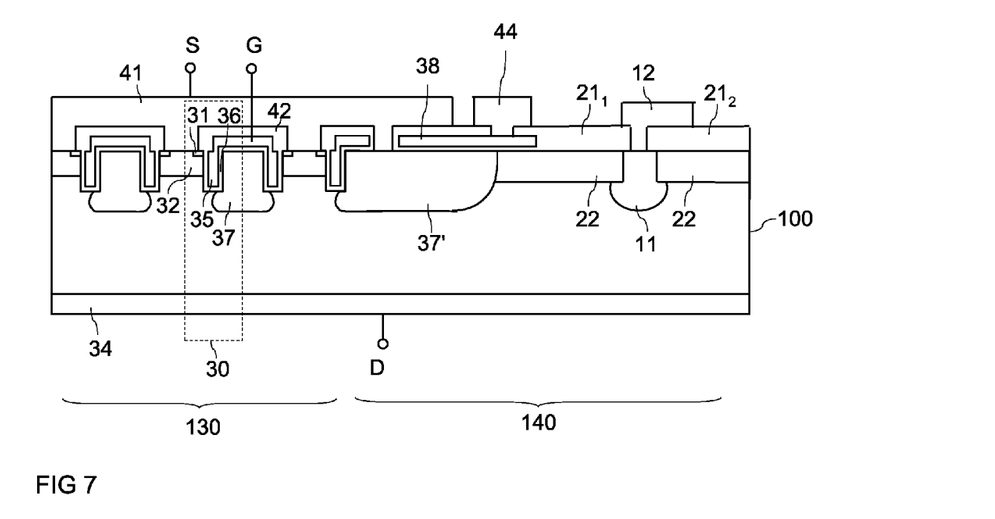
FIG. 7 illustrates one embodiment of a transistor device including an edge termination structure with a field ring.

The edge termination structure explained herein with reference to FIGS. 1 to 5 can be used in connection with a conventional semiconductor device, in particular a vertical power semiconductor device. Embodiments of vertical power transistors including an edge termination structure as explained with reference to FIGS. 1 to 5 hereinbefore are illustrated in FIGS. 6 and 7. FIGS. 6 and 7 each show a vertical cross sectional view of a section of a semiconductor body 100. These sections of the semiconductor body 100 illustrated in FIGS. 6 and 7 include a portion of the inner region 130, that includes active device regions, and a portion of the edge region 140 that includes the edge termination structure.

Referring to FIG. 6, the transistor device includes a plurality of transistor cells 30 in the inner region 130 of the semiconductor body 100. Each transistor cell 30 includes a source region 31, a body region 32 adjoining the source region 31, and a drift region 33 adjoining the body region 32. The drift region 33 is arranged between the body region 32 and a drain region 34. Optionally, a field stop region (not illustrated) of the same doping type as the drift region 33 but more highly doped than the drift region 33 can be arranged between the drift region 33 and the drain region 34. Further, each transistor cell 30 includes a gate electrode 35 adjacent the body region 32 and dielectrically insulated from the body region 32 by a gate dielectric 36. The individual transistor cells are connected in parallel by having the gate electrodes 35 connected to a common gate terminal G, and by having their source regions 31 electrically connected to a common source electrode 41 and a common source terminal S, respectively. Further, the individual transistor cells 30 have the drift region 33 and the drain region 34 in common. The transistor device is a vertical transistor device. The source regions 31 and the drain region 34 are spaced apart in the vertical direction (the direction perpendicular to the first surface 101 of the semiconductor body 100) of the semiconductor body 100.

The transistor device can be an n-type transistor device or a p-type transistor device. In an n-type transistor device, the source region 31 and the drift region 33 are n-doped, and the body region 32 is p-doped. In a p-type transistor device, the source region 31 and the drift region 33 are p-doped, while the body region 32 is n-doped. Further, the transistor device can be implemented as an enhancement device or as a depletion device. In an enhancement device, the body region 32 adjoins the gate dielectric 36. In a depletion device, there is a channel region of the same doping type as the source region 31 along the gate dielectric 32 between the source region 31 and the drift region 33. Further, the transistor device can be a MOSFET or an IGBT. In a MOSFET, the drain region 34 has the same doping type as the drift region 33 (that is more highly doped). In an IGBT, the drain region 34 has a doping type that is complementary to the doping type of the drift region 33. The doping concentration of the semiconductor body 100 in the edge region 140 may correspond to the doping concentration of the drift region 33. The IGBT may be implemented as an RC-(Reverse Conducting)-IGBT or as a conventional IGBT that is not reverse conducting.

Reference character 42 in FIG. 6 denotes insulation regions that insulate the source electrode 41 from the gate electrodes 35. The gate electrodes 35 are electrically connected to the gate terminal G in a region of the semiconductor body 100 that is out of view in FIG. 6. The gate electrodes 35 are implemented as trench electrodes in the embodiment of FIG. 6. That is, the gate electrodes 35 are arranged in trenches that extend into the semiconductor body 100 from the first surface 101. However, this is only an example. The gate electrodes 35 could also be implemented as planar electrodes above the first surface 101 of the semiconductor body (not illustrated).

In the transistor device of FIG. 6, there is a pn-junction between the drift region 33 and the body regions 32 of the individual transistor cells. When the transistor device is switched off, i.e., when the gate electrodes 35 are controlled such that a conducting channel between the source regions 31 and the drift region 33 is interrupted, and when a voltage is applied between the drain and source terminals D, S that reverse biases the pn-junction a space charge region (depletion region) expands in the drift region 33 beginning at the pn-junction. In an n-type MOSFET, a positive drain-source voltage (which is a voltage between the drain terminal D and the source terminal S) reverse biases the pn-junction, and in a p-type transistor device a negative drain-source voltage reverse biases the pn-junction. Referring to FIG. 6, the pn-junction between the body regions 32 and the drift region 33 is substantially parallel to the first surface 101 in the inner region 130 and terminates in a region between the inner region 130 and the edge region 140. Thus, in the inner region 130 the space charge region substantially expands in the vertical direction of the semiconductor body 100 as the drain-source voltage increases, while in the edge region 140 the space charge region substantially expands in the horizontal direction of the semiconductor body 100 as the drain-source voltage increases. One equipotential line of the electric field associated with the space charge region is illustrated in dashed and dotted lines in FIG. 6.

In the embodiment illustrated in FIG. 6, the edge termination structure includes only one field ring 11. The field ring 11 surrounds the inner region 130 in the way explained with reference to FIG. 2. However, the edge termination structure can easily be modified to include more than one field ring. Further, the edge termination structure may include other conventional edge termination structures, such as a field stopper in the region of the edge surface, or the like.

FIG. 7 illustrates a further embodiment of a transistor device. In this embodiment, each gate electrode 35 is adjacent one body region 32 on one side of the trench gate electrode and adjacent a floating semiconductor region 37 doped complementarily to the drift region 33 on an opposite side of the gate electrode 35. The complementary semiconductor regions 37 extend deeper into the semiconductor body than the trench gate electrodes 35 and protect bottom regions of the trenches against high electric fields. In an area of the edge region 140 that adjoins the inner region 130 a further semiconductor region 37' doped complementarily to the drift region 33 can be provided. This semiconductor region 37' can be connected to the source electrode 41.

Like in the embodiment of FIG. 6, the edge termination structure with the field ring 11 surrounds the inner region 130 with the transistor cells 30 of the transistor device. The semiconductor region 37, 37' and the field ring 11 may have substantially the same doping concentration. According to one embodiment, the field ring 11 and the semiconductor regions 37, 37' are produced in one common process sequence.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising a semiconductor body and an edge termination structure, wherein the edge termination structure comprises:
   a first oxide layer;
   a second oxide layer;
   a semiconductor mesa region between the first oxide layer and the second oxide layer; and
   a doped field region comprising a first section in the semiconductor mesa region, and a second section in a region below the semiconductor mesa region; and
   wherein the second section overlaps the first and the second oxide layers in a region below the semiconductor mesa region.

2. The semiconductor device of claim 1, wherein the semiconductor mesa region has a first width that is at least 3 µm.

3. The semiconductor device of claim 2,
   wherein the second section of the field region has a maximum second width, and
   wherein a difference between the maximum second width and the first width is between 0.2 µm and 10 µm.

4. The semiconductor device of claim 3, wherein the second section has the maximum width at the interface of the second section and the first and second oxide layer.

5. The semiconductor device of claim 3, wherein, in a vertical direction of the semiconductor body, a width of the second section decreases as a distance of the second section to the first oxide layer and the second oxide layer increases.

6. The semiconductor device of claim 1, wherein the first oxide layer and the second oxide layer do not extend beyond a top surface of the mesa region by more than 150 nanometers.

7. The semiconductor device of claim 1, wherein a depth of the first oxide layer and the second oxide layer is between 150 nanometers and 3 µm.

8. The semiconductor device of claim 1, wherein a depth of the second section of the field region is between 5 µm and 10 µm.

9. The semiconductor device of claim 1, further comprising:
- an insulation layer arranged above the first and second oxide layer and comprising an opening above the semiconductor mesa region; and
- a field electrode arranged above the insulation layer and electrically connected to the doped semiconductor region in the opening of the insulation layer.

10. A method for producing an edge termination structure, comprising:
- forming a first trench in a first surface of a semiconductor body;
- forming a second trench in the first surface of the semiconductor body, wherein the second trench is formed spaced apart from the first trench such that there is a semiconductor mesa region between the first trench and the second trench;
- forming a first oxide layer in the first trench by oxidizing the semiconductor body in regions adjacent the first trench;
- forming a second oxide layer in the second trench by oxidizing the semiconductor body in regions adjacent the second trench, wherein the first oxide layer and the second oxide layer are formed such that at least a section of the semiconductor mesa region remains between the first oxide layer and the second oxide layer; and
- introducing dopant atoms into the semiconductor mesa region and a region below the semiconductor mesa region.

11. The method of claim 10, further comprising polishing the semiconductor body in the region of a first surface after forming the first oxide layer and the second oxide layer.

12. The method of claim 10, wherein forming the first oxide layer and forming the second oxide layer comprises a common oxidation process.

13. The method of claim 10,
wherein the first oxide layer is formed in the first trench such that the first oxide layer substantially fills the first trench but does substantially not extend beyond the first surface, and
wherein the second oxide layer is formed in the second trench such that the second oxide layer substantially fills the second trench but does substantially not extend beyond the first surface.

14. The method of claim 10, wherein introducing dopant atoms comprises at least one of an implantation and a diffusion process.

15. The method of claim 10, wherein introducing dopant comprises:
- forming a mask layer that has an opening above the semiconductor mesa region; and
- introducing the dopant atoms through the opening in the mask layer into the semiconductor mesa region.

16. The method of claim 10, wherein introducing dopant atoms comprises an annealing process.

17. The method of claim 10,
wherein the semiconductor body comprises an inner region, and
wherein the first trench and the second trench are formed such that the semiconductor mesa region is ring-shaped and surrounds the inner region in a horizontal plane of the semiconductor body.

18. The method of claim 10, further comprising:
- forming a field electrode that is electrically connected to the semiconductor mesa region.

19. The method of claim 18, wherein forming the field electrode comprises:
- forming an insulation layer that comprises an opening above the semiconductor mesa region; and
- forming the field electrode in the opening of the insulation layer and on the insulation layer.

\* \* \* \* \*